United States Patent
Ikeda et al.

(10) Patent No.: US 7,580,073 B2
(45) Date of Patent: Aug. 25, 2009

(54) CHARGE COUPLED DEVICE

(75) Inventors: Katsumi Ikeda, Miyagi (JP); Makoto Kobayashi, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 323 days.

(21) Appl. No.: 11/656,501

(22) Filed: Jan. 23, 2007

(65) Prior Publication Data

US 2008/0030607 A1    Feb. 7, 2008

(30) Foreign Application Priority Data

Jan. 26, 2006 (JP) .......................... P2006-017763

(51) Int. Cl.
   *H04N 3/14* (2006.01)
   *H04N 5/335* (2006.01)
(52) U.S. Cl. .................. 348/311; 348/321; 348/323
(58) Field of Classification Search ................. 348/321, 348/323

See application file for complete search history.

(56) References Cited

U.S. PATENT DOCUMENTS

| | | | | |
|---|---|---|---|---|
| 5,486,859 A | * | 1/1996 | Matsuda | ...................... 348/311 |
| 6,031,571 A | * | 2/2000 | Arakawa | ...................... 348/316 |
| 7,355,644 B2 | * | 4/2008 | Tsuzuki | ...................... 348/299 |
| 7,489,357 B2 | * | 2/2009 | Nakada | ...................... 348/321 |

FOREIGN PATENT DOCUMENTS

JP          5-308575 A      11/1993

* cited by examiner

*Primary Examiner*—David L Ometz
*Assistant Examiner*—Pritham Prabhakher
(74) *Attorney, Agent, or Firm*—Birch, Stewart, Kolasch & Birch, LLP

(57) ABSTRACT

A charge coupled device comprises: a semiconductor substrate of one conductivity type; a one-dimensional first charge coupled device including a plurality of continuous electrodes arranged in a one-dimensional array on the semiconductor substrate and a channel region formed below each of the electrodes; a second charge coupled device that is continuous to an end of the first charge coupled device and includes two branched portions, each of the two branched portions comprising at least one electrode arranged in the one-dimensional array; a detecting portion that detects as an electrical signal a charge transferred by each of the branch portions of the second charge coupled device; and a signal output portion that outputs a signal detected by the detecting portion, wherein distal one of the electrodes of the first charge coupled device, which is adjacent to the second charge coupled device, is formed independently from the other ones of the electrodes of the first charge coupled device so as to be fixed at a predetermined dc potential.

6 Claims, 16 Drawing Sheets

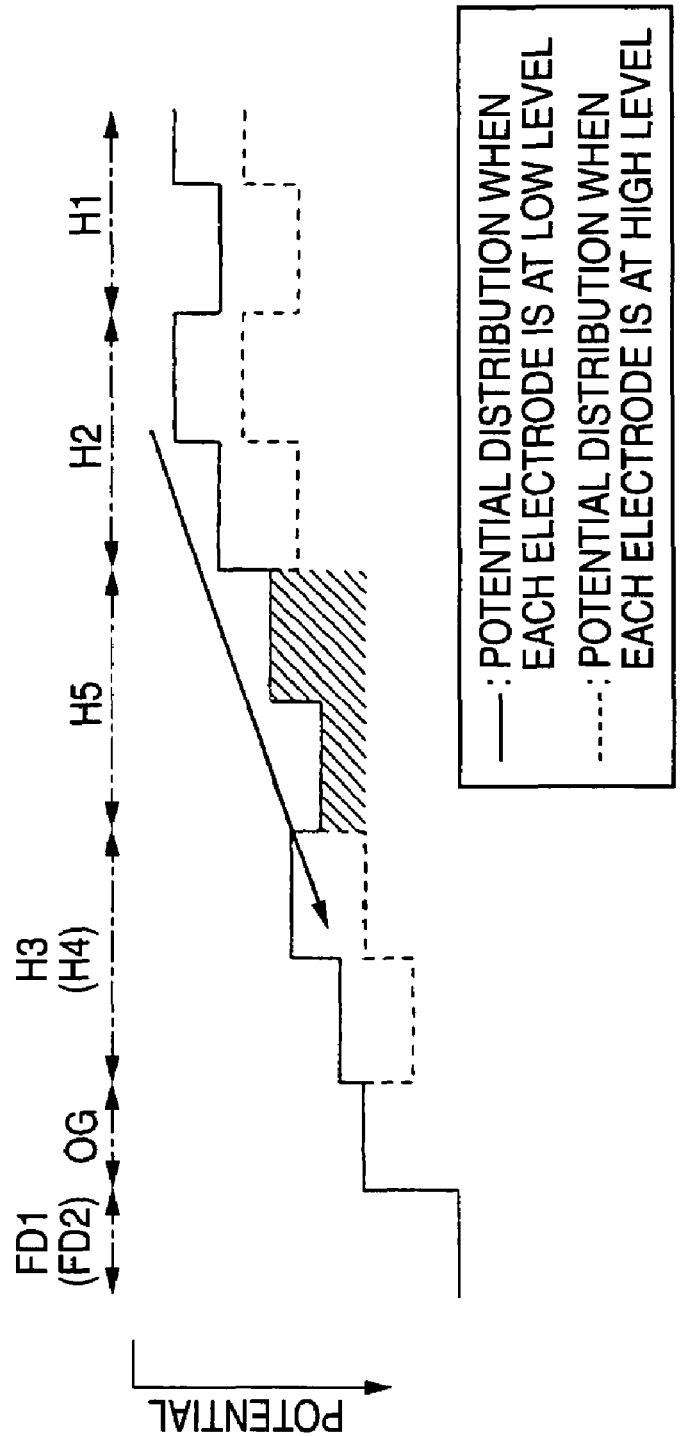

CHARGE COUPLED DEVICE

BACKGROUND OF THE INVENTION

1. Field of the Invention

The present invention relates to a charge coupled device having a bifurcated signal output path, and more particularly to a technique for improving the charge transfer efficiency.

2. Description of the Related Art

An example of the configuration of a general charge coupled device (CCD) having a bifurcated signal output path is shown in FIG. 11. FIG. 11 is a plan view of essential portions of the charge coupled device. In this charge coupled device, the signal output path is branched into two lines to alternately distribute and output signal charges, whereby the operating frequency of the circuit of a portion for outputting the signal is reduced to one-half.

In the drawing, reference numeral 7 denotes a first layer electrode, numeral 8 denotes a second layer electrode, and numerals 3 and 4 denote impurity regions below the respective electrodes (7 and 8). In addition, numeral 5 denotes a floating diffusion region (an impurity diffusion layer where the potential is not fixed; also referred to as FD1 and FD2), and numeral 9 denotes an output circuit.

As shown in the drawing, this charge coupled device (CCD) is formed such that electrodes which are driven by two-phase clocks H1 and H2 are arranged in a one-dimensional array, and the channel is branched into two lines at an end of the one-dimensional CCD. Electrodes of the CCD at the portion branched into two lines are respectively driven by two-phase clocks H3 and H4.

The electric charges transferred through the one-dimensional CCD are alternately distributed and outputted to respective CCD portions of the two lines as the electrodes on the branched CCD side are driven. Namely, the pair of floating diffusion regions 5 (FD1 and FD2) for detecting the transferred signal charge are respectively provided at ends of the two branch portions of the CCD, and the pair of output circuits 9 for detecting and outputting the potential change are respectively connected to the FD1 and FD2. Further, detection signals are outputted from signal output ends (OS1 and OS2) of the respective output circuits 9.

In addition, reset transistors (RS1 and RS2) for discharging the detected signal charge at a desired timing are respectively connected to FD1 and FD2. A common junction of the reset transistors (RS1 and RS2) serves as a reset drain (RD).

The CCD is of a two-phase drive type, and two-phase clocks are respectively imparted to the first layer electrodes 7 and the second layer electrodes 8. The channel immediately below the first electrode 7 is formed with a deeper potential than the channel immediately below the second layer electrode 8, and at the time of the transfer of the signal charge the signal charge is temporarily accumulated in the channel immediately below the first layer electrode 7.

The charge coupled device (CCD) having the configuration of FIG. 11 is described in, for instance, JP-A-5-308575. In the CCD of JP-A-5-308575, the electrodes after the branching of the channel are arranged from an electrode OG to FD. In the explanation of FIG. 11, it is assumed for convenience' sake that OG is set at a fixed voltage, and that controlling electrodes H3 and H4 are disposed therebetween. However, it is construed that control based on OG and control based on H3 and H4 in JP-A-5-308575 are equivalent.

Next, a description will be given of the operation this charge coupled device (CCD) with reference to a signal waveform diagram of FIG. 12 illustrating timings for driving the CCD.

φH1 and φH2 denote binary pulses of mutually opposite phases with a duty ratio of 50%, which are applied to the respective electrodes H1 and H2 in FIG. 11. φH3 and φH4 denote binary pulses of mutually opposite phases with a duty ratio of 50%, which are driven by frequencies in which φH1 and φH2 are divided into two, and which are applied to the respective electrodes H3 and H4 in FIG. 11.

φRS1 and φRS2 denote pulses of the same frequency as φH3 and φH4, but have a duty ratio of 25%. φRS1 corresponds to the rise of φH3, while φRS2 corresponds to the rise of φH4, and both φRS1 and φRS2 are respectively applied to the terminals RS1 and RS2 in FIG. 11.

FIGS. 13A and 13B are cross-sectional views, respectively taken along lines C-C' and D-D' in FIG. 11, illustrating the structure of these portions.

As shown in the drawings, an impurity layer 2 of an opposite conductivity type (P type) to that of a semiconductor substrate 1 of one conductivity type (e.g., N type) is formed on the obverse layer side of the semiconductor substrate 1, and the impurity layers 3 and 4 of an opposite conductivity type (N type) to that of the impurity layer 2 are formed on the impurity layer 2 on the obverse surface of the substrate 1. As for these impurity layers 3 and 4, the impurity layer 4 is relatively thinner than the impurity layer 3. In addition, a diffusion layer 5 is formed at a lateral end of the impurity layers 3 and 4.

The first layer electrodes 7 are formed on the semiconductor substrate 1 via an insulating layer 6, and the second layer electrodes 8 are respectively formed on both these first layer electrodes 7 and the substrate 1 via the insulating layers 6 and 6a. In addition, the impurity layer 3 is disposed below OG, and the impurity layer 3 is disposed below the first layer electrodes 7 as for below the other electrodes H1 to H4, while the impurity layer 4 is disposed below the second layer electrodes 8. The first layer electrode 7 and the second layer electrode 8 are electrically connected, as shown in FIG. 11, and are driven by the respective drive signals shown in FIG. 12, thereby realizing the operation of the known two-phase drive CCD.

Hereafter, a description will be given of the drive of the portion branched into two lines in the CCD.

FIG. 14 is a potential diagram of the C-C' and D-D' portions in FIGS. 13A and 13B during the period from the time t1 to the time t4 shown in the signal waveform diagram in FIG. 12.

As shown in the drawing, the signal charge transferred by the drive of the electrodes H1 and H2 is branched toward the two output terminals (OS1 and OS2) by controlling the drive of the electrodes H3 and H4. The drive period of the electrodes H3 and H4 is two times the drive period of the electrodes H1 and H2. For example, if it is assumed that the electrodes H1 and H2 are driven at 60 MHz, the electrodes H3 and H4 are driven at 30 MHz.

In the CCD shown in FIG. 11 and having the signal output path branched into two lines, when the charge is transferred from the CCD arranged in a one-dimensional array to the CCD at the portion branched into two lines, despite the fact that a long transfer time is required for it, it is, in reality, difficult to secure a sufficient transfer time, and the transfer efficiency declines for that reason.

Hereafter, a specific description will be given of this aspect.

FIG. 15 is a diagram schematically illustrating the manner of movement of the charge in a channel region for constituting the CCD shown in FIG. 11. FIG. 15 shows the manner of movement of the charge at a time t3 in FIGS. 12 and 14. It should be noted that, in the drawing, the charge is shown by "e."

As shown in the drawing, in the one-dimensional CCD, the charge is transferred smoothly from the right side toward the left side in synchronism with the two-phase clock. However, the transfer of the charge from the channel region at the final end of the one-dimensional CCD to the channel region of the CCD at the portion branched into two lines does not suffice to merely transfer the charge from right to left, and the situation is different since the charge transfer distance inevitably becomes long.

Namely, in FIG. 15, although the charge is transferred to one branched (upper side) CCD, the charge is extensively distributed in the channel region (X) at the final end of the CCD which is arranged in the one-dimensional array and is adjacent to that branched CCD. In FIG. 15, the charge (e) at the lower portion in the drawing of that channel region (X) moves a long way toward the upper side in the drawing, and subsequently flows into the channel of the one branched (upper side in the drawing) CCD. Since the charge transfer time is determined by the potential and the transfer distance, the longer the transfer distance, the longer the transfer time.

Accordingly, if the time for transferring the charge to the CCD at the portion branched into two lines can be made sufficiently long, the transfer efficiency would improve. In reality, however, the charge transfer time is strictly regulated by the period of the two-phase drive, and it is impossible to make long only the time for transferring the charge to the CCD at the portion branched into two lines.

FIG. 16 is a timing diagram illustrating the detailed waveforms and phases, which are close to actual ones, of the respective transfer pulses shown in FIG. 12.

In FIG. 16, Tst1 and Tst2 denote periods of L and H of φH1 (periods of H and L of φH2), and Tsrf1 and Tsrf2 denote transition times. Meanwhile, Tpt1 and Tpt2 denote periods of H and L of φH3 (periods of L and H of φH4), and Tprf1 and Tprf2 denote transition times. In addition, Tsp3 and Tsp4 denote periods corresponding to Tst1 and Tst2.

In the period of t1 to t4 shown in FIG. 12, the charge transfer time in the channel below the electrodes (H1 and H2) is determined by Tst1 and Tst2 shown in FIG. 16. Namely, since the storage and transfer of the signal charge are repeated by the two-layer clocks φH1 and φH2, of the one-half period of φH1 (φH2), the portion (i.e., Tst1 and Tst2) excluding the transition times can be used as the effective transfer time.

Similarly, the time for transferring the charge from the electrode H1 adjacent to the electrodes H3 and H4 to the channel region below the electrodes (H3 and H4) is determined by Tsp3 and Tsp4. Namely, as the signal output path is branched into two lines to alternately distribute and output the signal charges, the operating frequency of the circuit of the portion for outputting the signal becomes one-half, alleviating the burden of the circuit associated with that portion. And yet, the charge transfer time is no different from the related-art example, and it is only Tsp3 and Tsp4 (=Tst1 and Tst2) of φH3 (φH4) that can be used as the effective transfer time.

Thus, in the transfer of charges to the CCD at the portion branched into two systems, extra time is inevitably required in light of the structure of the device, the actual time for transferring the charge is controlled by the frequency of the two-phase clock as in the related-art manner, and it is difficult to make the transfer time long. In this case, there can occur a situation in which the charge transfer fails to be completed within a predetermined transfer time, resulting in a decline in the charge transfer efficiency.

Accordingly, in a case where the CCD shown in FIG. 11 is used as, for example, a horizontal CCD of a solid-state imaging device in which photodiodes are arranged in a two-dimensional array, the drifting of an image and the deterioration of the resolution can possibly result. In addition, in the case of a solid-state imaging device in which a color filter is laminated on the photodiodes to obtain a color signal, there can be cases where a pseudo-color signal is generated, resulting in the deterioration of the image.

SUMMARY OF THE INVENTION

The invention has been devised in view of the above-described problems, an its object is to make long the effective charge transfer time for transferring the charge to the branch portion in a CCD having a signal output path branched into two lines, to thereby improve the transfer efficiency.

The above object in accordance with the invention is attained by the following configuration:

(1) A charge coupled device comprising: a semiconductor substrate of one conductivity type; a one-dimensional first charge coupled device including a plurality of continuous electrodes arranged in a one-dimensional array on the semiconductor substrate and a channel region formed below each of the electrodes; a second charge coupled device that is continuous to an end of the first charge coupled device and includes two branched portions, each of the two branched portions comprising at least one electrode arranged in the one-dimensional array; a detecting portion that detects as an electrical signal a charge transferred by each of the branch portions of the second charge coupled device; and a signal output portion that outputs a signal detected by the detecting portion, wherein distal one of the electrodes of the first charge coupled device, which is adjacent to the second charge coupled device, is formed independently from the other ones of the electrodes of the first charge coupled device so as to be fixed at a predetermined dc potential, and wherein each of the electrodes of the first charge coupled device and one of said at least one electrode of each of the two branched portions of the second charge coupled device, which is adjacent to the distal one of the electrodes of the first charge coupled device, is driven such that a step-like potential continuous toward a downstream side in a charge transferring direction is formed, wherein a signal charge from the channel region below the electrodes of the first charge coupled device passes through a first channel region below the distal one of the electrodes of the first charge coupled device which is fixed at the predetermined dc potential, and is transferred so as to reach the channel region below said at least one electrode of each of the two branched portions of the second charge coupled device without being accumulated midway in the transfer from the first charge coupled device to the second charge coupled device.

According to the charge coupled device in accordance with the invention, by changing the electrode structure and the drive system, control based on the frequency of the two-phase clocks is severed, making it possible to secure a longer transfer time. Namely, the branch electrode is made independent from the other electrodes of the CCD arranged in a one-dimensional array, and a predetermined dc potential is applied to that branch electrode. Namely, the potential below the branch electrode does not change. In addition contrivances are made in such as voltages and drive timings for driving the upstream-side electrode and the downstream-side electrodes (i.e., the electrodes of the second charge coupled device branched into two lines), which are adjacent to that branch electrode, such that a temporally continuous step-like potential can be formed. By virtue of the above-described arrangement, the charge transferred from the channel region below the upstream-side electrode adjacent to the branch electrode directly "passes" below the branch electrode and moves to the channel region below the downstream-side electrodes (i.e., the electrodes of the charge coupled device branched into two lines) without being accumulated. Since the potential at the branch electrode is fixed to a predetermined dc potential, the restriction of the charge transfer time by the two-phase clocks of a high frequency is stopped here, and the charge pushed out from the upstream side, without being accumulated, "passes" below the branch electrode and flows further into the channel region of the CCD branched into two lines. For this reason, as the effective transfer time, it becomes possible to effectively use substantially one-half of the drive period of the electrodes of the charge coupled device branched into two lines. Hence, the transfer time becomes long, the transfer efficiency is improved, and the occurrence of a decline in image quality is prevented.

(2) The charge coupled device according to (1) above, wherein the plurality of continuous electrodes of the first charge coupled device are driven by two-phase clocks of a predetermined frequency having inverse phases to one another, and one of said at least one electrode of each of the two branched portions of the second charge coupled device, which is adjacent to the distal one of the electrodes of the first charge coupled device fixed at the predetermined fixed potential, is driven by a two-phase clock having a period two times the two-phase clocks applied to the first charge coupled device.

According to this charge coupled device, the downstream-side electrodes (i.e., the electrodes of the second charge coupled device branched into two lines) adjacent to the branch-side electrode are driven by two-phase clocks of a frequency which is one-half of that of the upstream-side electrodes (the electrodes of the first charge coupled device) adjacent to the branch-side electrode, thereby making it possible to alleviate the burden of the circuit around the signal output end.

(3) The charge coupled device according to (1) or (2) above, wherein, by using as a boundary the first channel region below the distal one of the electrodes of the first charge coupled device fixed at the predetermined fixed potential, an impurity layer of a conductivity type that increases the potential is further provided at a portion of the channel region on the downstream side in the charge transferring direction of the first channel region.

According to this charge coupled device, by using as a boundary the channel region below the electrode at the end of the first charge coupled device, an impurity layer of a conductivity type for increasing the potential is formed at a portion of the channel region on the downstream side in the charge transferring direction. Hence, a step-like potential which is continuous from the first charge coupled device to the second charge coupled device is structurally formed. As a result, the charge which has been transferred from the channel region of the first charge coupled device can be moved to the channel region of the second charge coupled device without being accumulated midway.

(4) The charge coupled device according to (1) or (2) above, wherein, by using as a boundary the first channel region below the distal one of the electrodes of the first charge coupled device fixed at the predetermined fixed potential, an impurity layer of a conductivity type that decreases the potential is further provided at a portion of the channel region on an upstream side in the charge transferring direction of the first channel region.

According to this charge coupled device, by using as a boundary the channel region below the electrode at the end of the first charge coupled device, an impurity layer of a conductivity type for decreasing the potential is formed at a portion of the channel region on the upstream side in the charge transferring direction. Hence, a step-like potential which is continuous from the first charge coupled device to the second charge coupled device is structurally formed. As a result, the charge which has been transferred from the channel region of the first charge coupled device can be moved to the channel region of the second charge coupled device without being accumulated midway.

BRIEF DESCRIPTION OF THE DRAWINGS

FIG. 3 is a diagram illustrating a change of the potential along lines A-A' and B-B' of the HCCD shown in FIG. 1;

DETAILED DESCRIPTION OF THE INVENTION

Referring next to the drawings, a detailed description will be given of a preferred embodiment of the charge coupled device in accordance with the invention.

Figure 1:
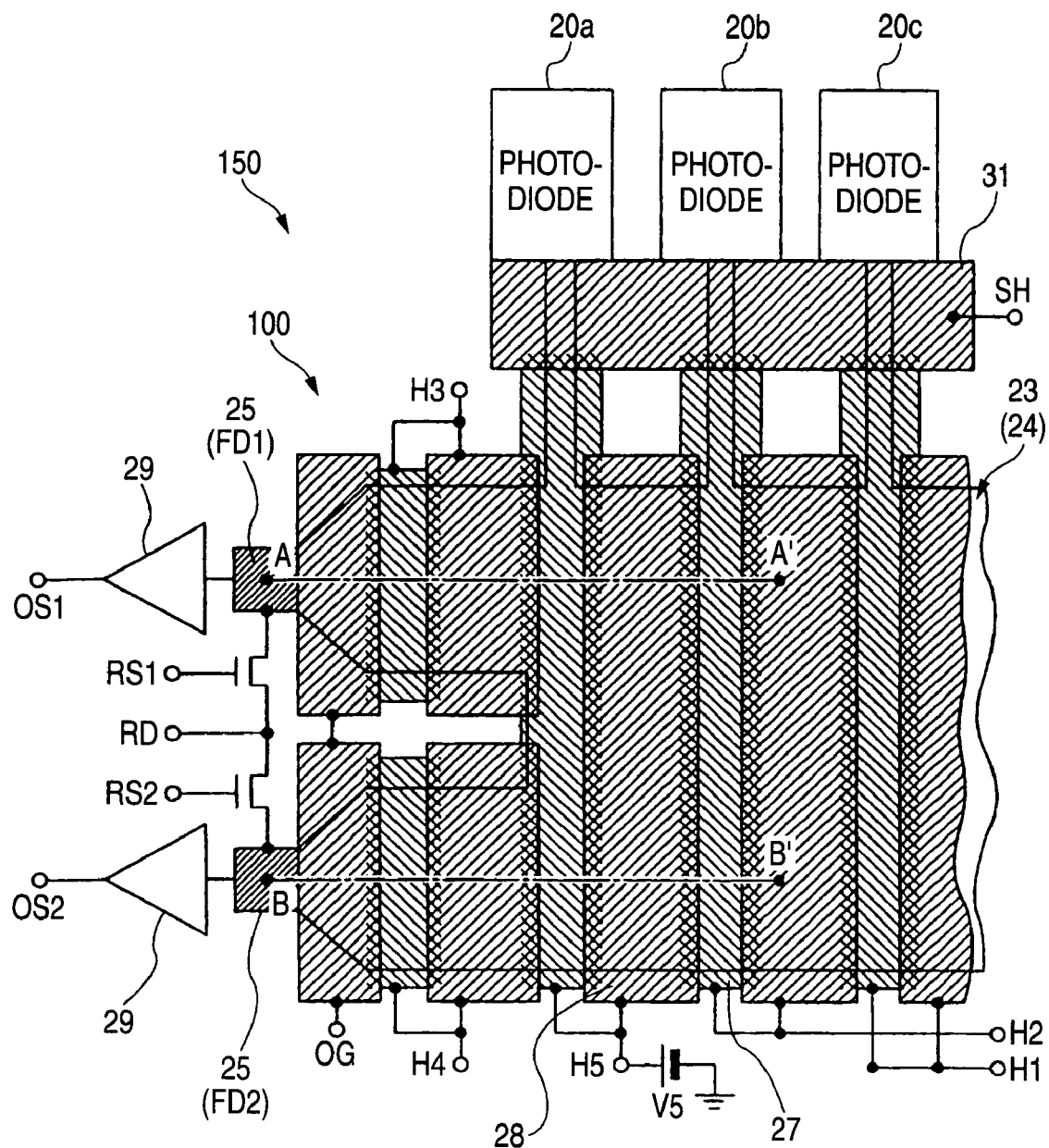
FIG. 1 is a plan view of essential portions illustrating the configuration of a charge coupled device in accordance with the invention which has a signal output path branched into two lines.

FIG. 1 is a plan view of essential portions illustrating the configuration of the charge coupled device in accordance with the invention which has a signal output path branched into two lines.

In a charge coupled device 100 in accordance with this embodiment, the signal output path is branched into two lines, and signal charges are alternately distributed and outputted thereto so as to reduce to one-half the operating frequency of the circuit of a portion for outputting the signal, thereby alleviating the burden of the circuit.

A solid-state imaging device 150 is comprised of a plurality of photoelectric conversion devices (photodiodes) 20a, 20b, 20c, ..., which are arranged in a one-dimensional array; a line memory 31 for temporarily storing signal charges which have been read from the photodiodes; the charge coupled device (i.e., a HCCD consisting of a first charge coupled device before branching and a second charge coupled device after branching) 100 which is arranged in a one-dimensional array and whose channel is branched into two lines in the vicinity of its end; a pair of floating diffusion (FD) regions 25 each provided at an end of the HCCD after branching to detect the transferred signal charge; and a pair of output circuits (output amplifiers) 29 for detecting and outputting a change in the potential of the FD region 25. Further, the FD regions 25 have reset transistors RS1 and RS2 and a reset drain RD for discharging the detected signal charge at a desired timing. It should be noted that the line memory 31 may be omitted in the configuration.

Figure 11:
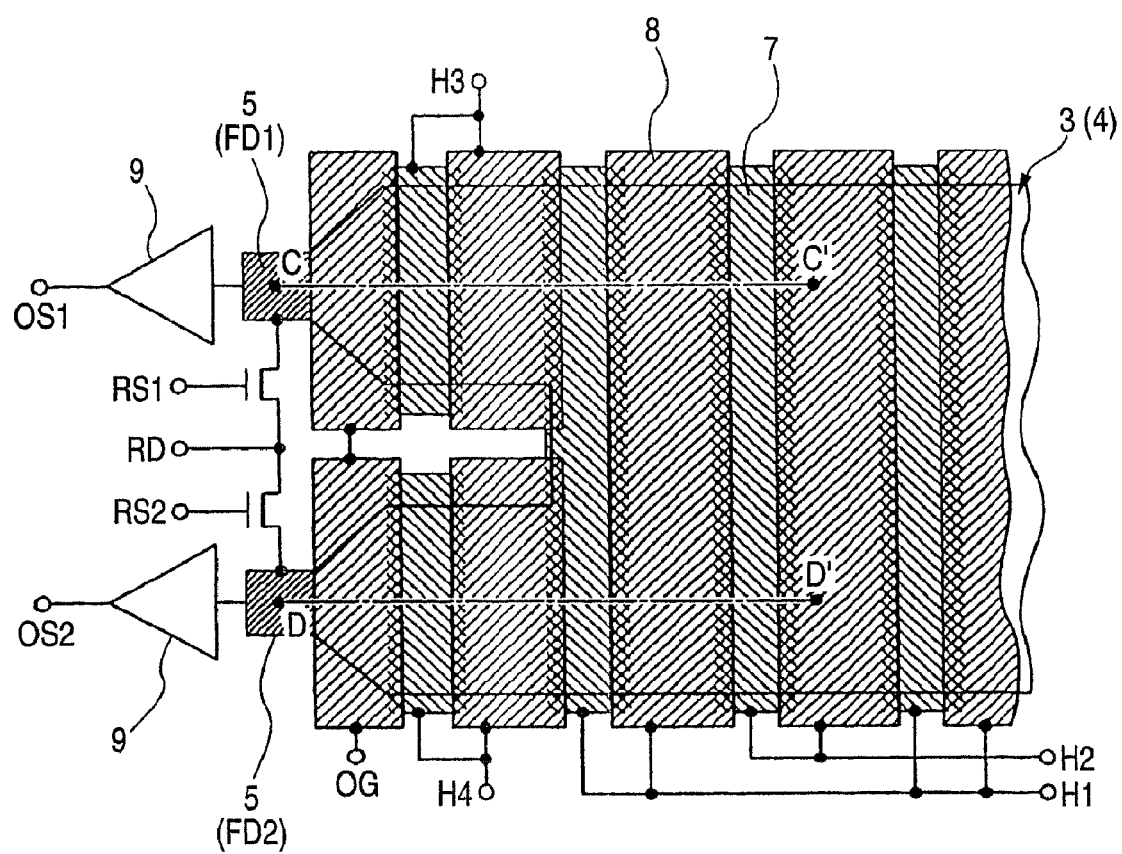
FIG. 11 is a plan view of essential portions illustrating an example of the configuration of the related-art charge coupled device which has a signal output path branched into two lines.

In the drawing, first layer electrodes 27, second layer electrodes 28, impurity regions 23 and 24 below the respective electrodes (27 and 28), the FD regions 25, and the output circuits 29 are similar to those shown in FIG. 11, but the configuration differs in that portions of H1 and H2 are changed to H5.

H1 and H2 denote electrodes which are driven by the respective clocks and are arranged continuously in a one-dimensional array, and φH1 and φH2, which are two-phase clocks of opposite phases and of a predetermined frequency are respectively inputted thereto. Further, H3 and H4 denote electrodes of the portion branched into two lines, and are driven by respective clocks. φH3 and φH4 denote two-phase clocks for driving the portion branched into two lines, and have a period two times that of φH1 and φH2. In addition, OG denotes an electrode of a portion for transferring the signal charge of the HCCD to the FD region 25 (FD1, FD2).

Thus, the charge coupled device (HCCD) has electrodes which are driven by the two-phase clocks φH1 and φH2, and is formed by being arranged in a one-dimensional array. Further, the channel is branched into two lines at an end of the one-dimensional HCCD, and respective electrodes of the HCCD at the portion branched into two lines are driven by two-phase clocks φH3 and φH4.

The electric charges transferred through the one-dimensional first charge coupled device are alternately distributed and outputted to the respective charge coupled device portions of the two lines as the electrodes on the branched second charge coupled device side are driven. Namely, the pair of output circuit paths 29 for detecting and outputting the potential change are respectively connected to the FD regions 25 (FD1 and FD2) which are provided at ends of the two branch portions of the second charge coupled device branched into two lines and which detect the signal charge transferred thereto. Respective detection signals are outputted from signal output ends OS1 and OS2 of these output circuits 29.

Reset transistors (RS1 and RS2) for discharging the detected signal charge at a desired timing are respectively connected to FD1 and FD2. A common junction of the reset transistors (RS1 and RS2) serves as a reset drain (RD).

The HCCD is of a two-phase drive type, and two-phase clocks are respectively imparted to the first layer electrodes 27 and the second layer electrodes 28. The channel immediately below the first electrode 27 is formed with a deeper potential than the channel immediately below the second layer electrode 28, and at the time of the transfer of the signal charge the signal charge is temporarily accumulated in the channel immediately below the first layer electrode 27.

In the related-art charge coupled device shown in FIG. 11, the time for transferring the charge from the channel region below the branch electrode H5 (which is an electrode at the final end of the CCD which is arranged in the one-dimensional array and is adjacent to that branched CCD) to the channel region of the charge coupled device at the portion branched into two lines is controlled by the periods of two-phase clocks of a high frequency (φH1 and φH2). However, in the charge coupled device of the invention shown in FIG. 1, by changing the electrode structure and the drive system, control based on the frequency of the two-phase clocks (φH1 and φH2) is severed, to thereby make it possible to secure a longer transfer time.

Namely, in the HCCD shown in FIG. 1, the branch electrode (H5) is made independent from the electrodes 27 and 28 (H1 and H2) of the HCCD arranged in the one-dimensional array, and a predetermined dc voltage V5 is applied to that branch electrode (H5). Namely, the potential below the branch electrode (H5) does not change.

In addition, contrivances are made in such as drive voltages and drive timings for driving the electrode (H2) on the upstream side in the charge transporting direction and the downstream-side electrodes H3 and H4 (i.e., the electrodes of the second charge coupled device branched into two lines), which are adjacent to that branch electrode (H5), as well as their and structures, such that a temporally continuous step-like potential can be formed.

Figure 2A:
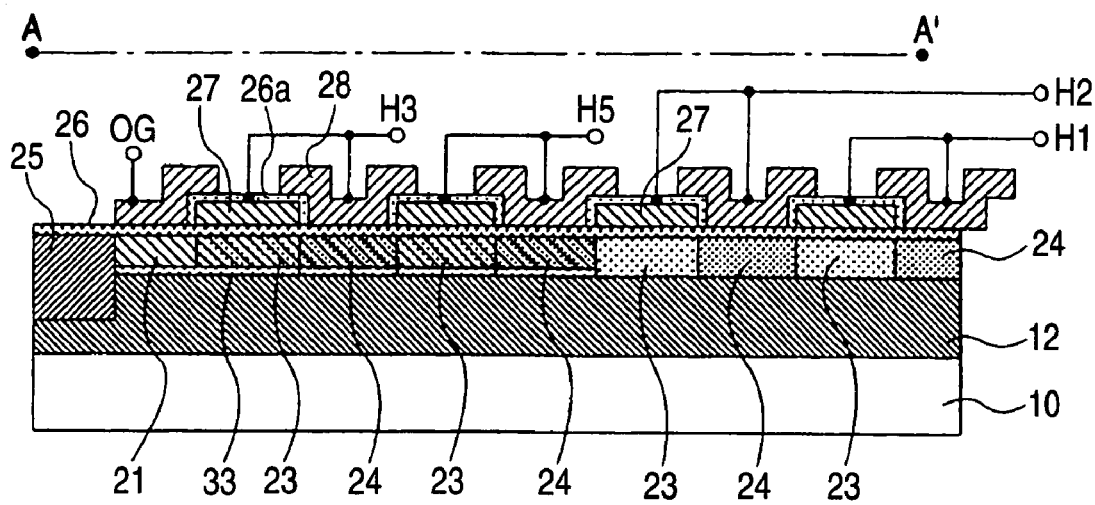
FIGS. 2A and 2B are cross-sectional views, respectively taken along lines A-A' and B-B' in FIG. 1, illustrating the structure of an example of the device in accordance with the invention.
Figure 2B:
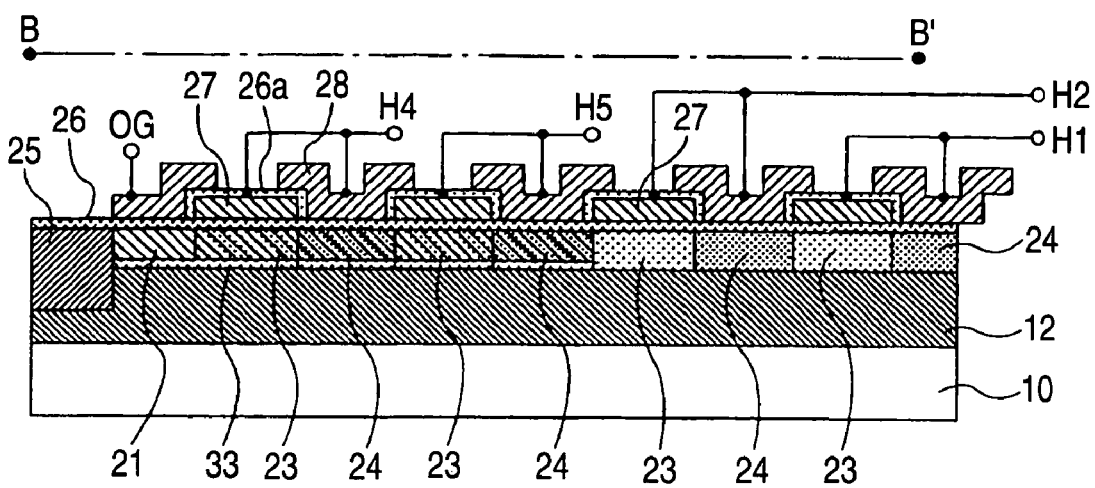

FIGS. 2A and 2B are cross-sectional views, respectively taken along lines A-A' and B-B' in FIG. 1, illustrating the structure of these portions.

As shown in the drawings, an impurity layer 12 of an opposite conductivity type (P type) to that of a semiconductor substrate 10 of one conductivity type (e.g., N type) is formed on the obverse layer side of the semiconductor substrate 10, and the impurity layers 23 and 24 of an opposite conductivity type (N type) to that of the impurity layer 12 are formed on the impurity layer 12 the obverse surface of the substrate 10. As for these impurity layers 23 and 24, the impurity layer 24 is relatively thinner than the impurity layer 23. In addition, the diffusion layer 25 is formed at a lateral end of the impurity layers 23 and 24.

Figure 12:
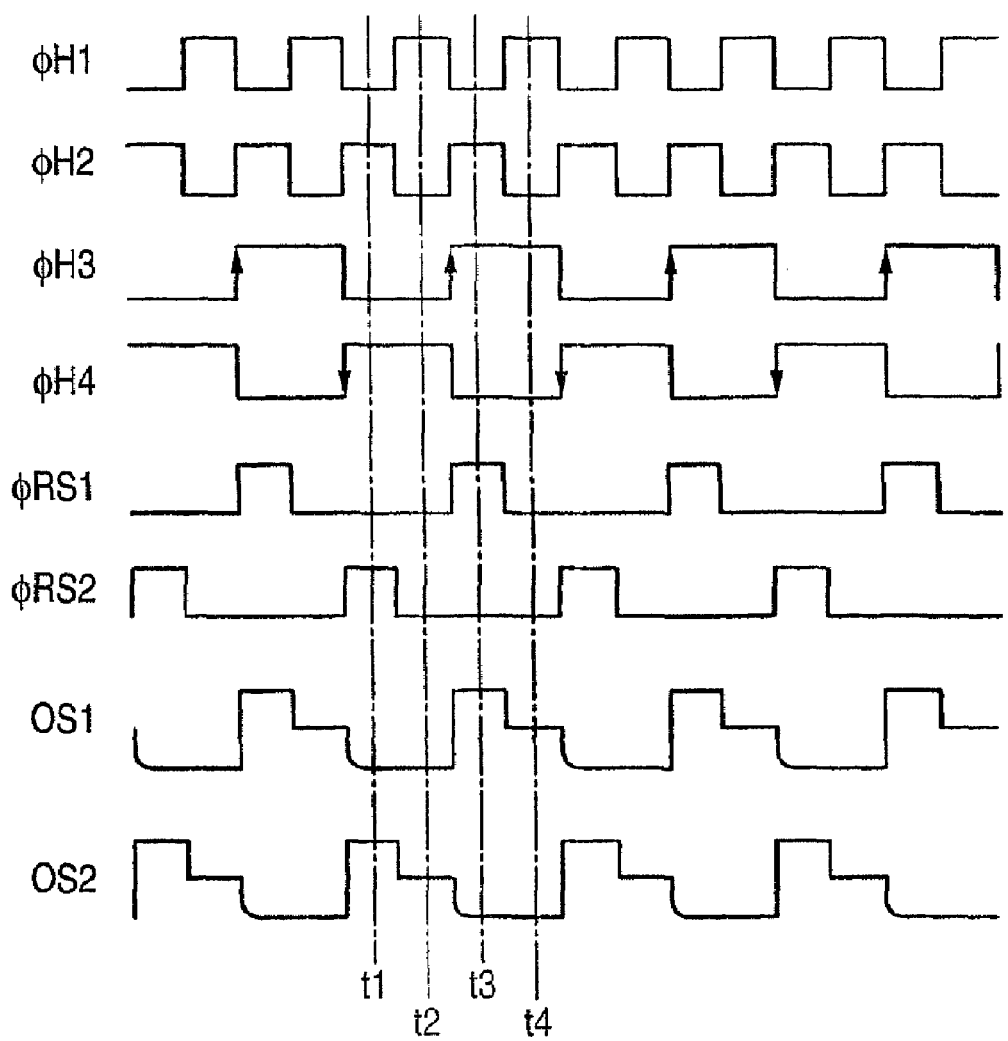
FIG. 12 is a signal waveform diagram illustrating timings for driving the CCD shown in FIG. 11.

The first layer electrodes 27 are formed on the semiconductor substrate 10 via an insulating layer 26, and the second layer electrodes 28 are respectively formed on both these first layer electrodes 27 and the substrate 10 via the insulating layers 26 and 26a. In addition, an impurity layer 21 is disposed below OG, and the impurity layer 23 is disposed below the first layer electrodes 27 as for below H1 to H54, while the impurity layer 24 is disposed below the second layer electrodes 28. Further, an impurity layer 33 is newly formed in the channel below each of OG, H3, H4, and H5. The impurity layer 33 of an opposite conductivity type to the impurity layer 12. In addition, the first layer electrode 27 and the second layer electrode 28 are electrically connected, as shown in FIG. 1, and are driven by the respective drive signals shown in FIG. 12, thereby realizing the operation of the known two-phase drive CCD.

By virtue of the above-described arrangement, the signal charge sent out from the channel region below the upstream-side electrode (H2) adjacent to the branch electrode (H5) passes below the branch electrode (H5) and moves to the channel region below the downstream-side electrodes H3 and H4 (the electrodes of the second charge coupled device branched into two lines) without being accumulated.

Since the potential at the branch electrode is fixed to a predetermined dc potential (V5), the restriction of the charge transfer time by the two-phase clocks (φH1 and φH2) of a high frequency is stopped here, and the charge pushed out from the upstream side, without being accumulated, passes below the branch electrode (H5) and flows further into the channel region of the charge coupled device branched into two lines. For this reason, as the effective transfer time, it becomes possible to effectively use substantially one-half of the drive period of the electrodes of the charge coupled device branched into two lines. Hence, the transfer time becomes long, the transfer efficiency is improved, and the occurrence of a decline in image quality is prevented.

Here, a detailed description will be given of the reason why the transfer time is becomes long, as described above.

FIG. 3 is a diagram illustrating a change of the potential along lines A-A' and B-B' of the HCCD shown in FIG. 1.

In FIG. 3, the solid line shows the distribution of the potential when the drive signal applied to each electrode is at a low level, and the dotted line shows the distribution of the potential when it is at a high level. The potential corresponding to the electrode (H5) and shown by hatched lines in the center of FIG. 3 is the potential which is fixed by the fixed dc voltage V5 and does not change with time. In addition, the reason that the potential of H3, H4, and OG in the drawing is higher (lower in the drawing) than the potential on the H1 and H2 side is that the potential distribution has changed due to the presence of the impurity layer 33.

Here, the potential which is fixed and corresponds to this electrode (H5) is present as a kind of barrier. If it is now assumed that the drive signal of the upstream-side electrode (H2) is set to a low level, and that potential becomes lower (the potential of the electrode H2 shown by the solid line in FIG. 3) than the potential of the electrode (H5), the signal charge is transferred to the channel region below the electrode (H5) and passes through the channel region of the electrode (H5).

Then, as the drive signal of the downstream-side electrodes (H3 and H4) changes to a high level, a step-like potential which is continuous to the potential (fixed) below the electrode (H5) is further formed, and the signal charge which has passed below the electrode (H5) is continuously transferred to the high potential side without being accumulated in the region of the electrode (H5). Accordingly, the signal charges are smoothly and reliably transferred to the channel region of the charge coupled device branched into two lines.

Figure 13A:
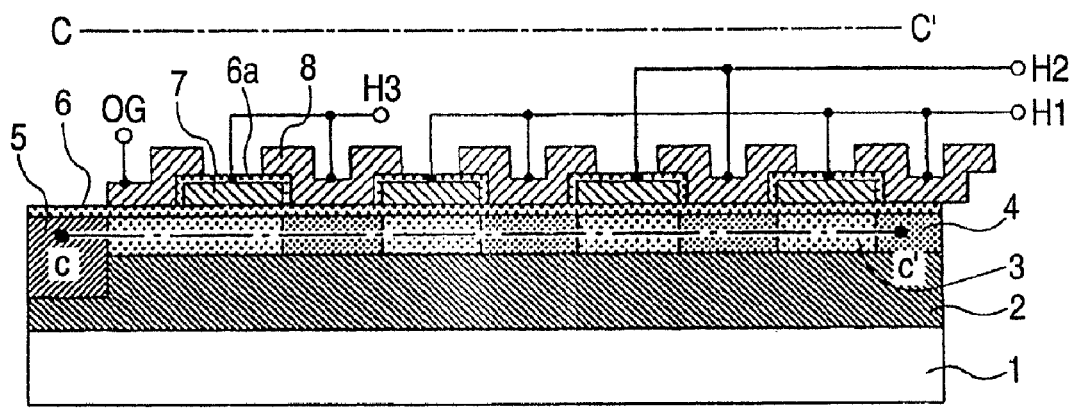
FIGS. 13A and 13B are cross-sectional views, respectively taken along lines C-C' and D-D' in FIG. 11, illustrating the structure of these portions.
Figure 13B:
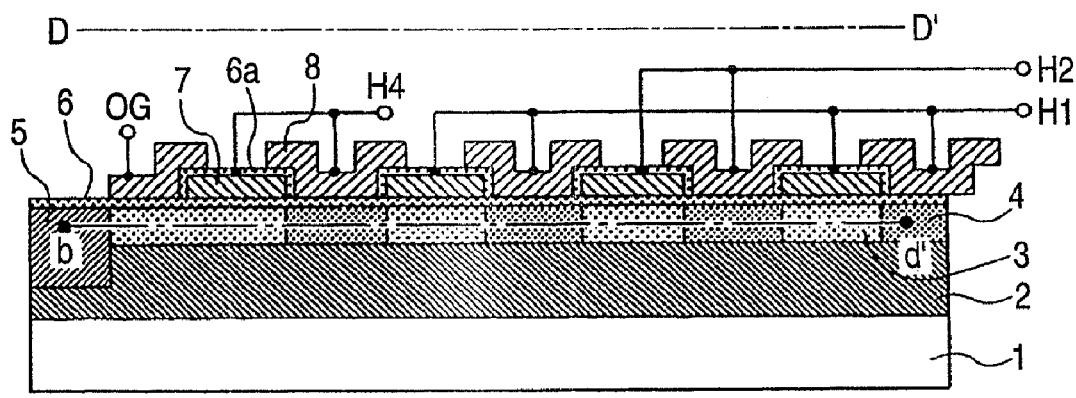
Figure 14:
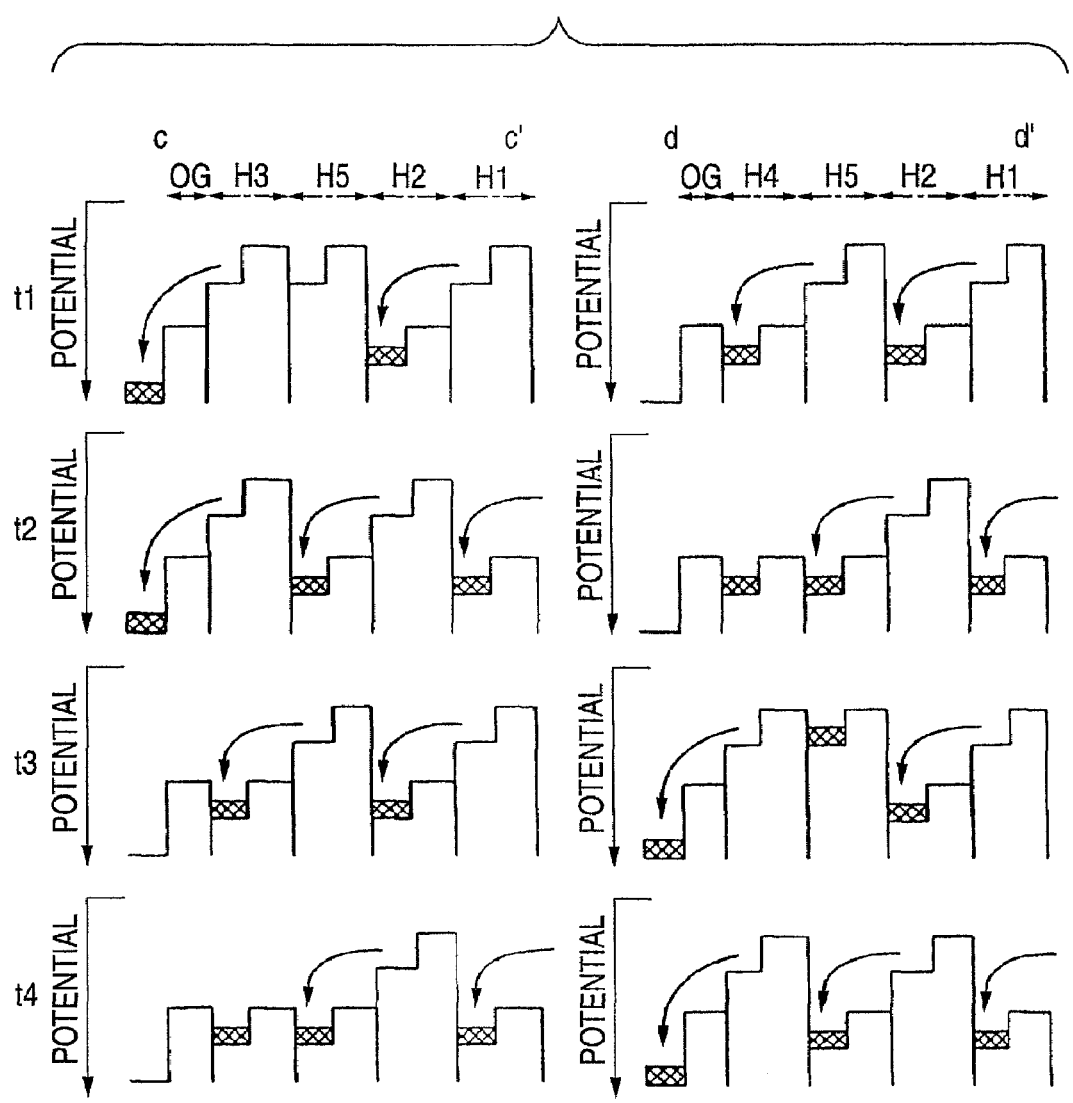
FIG. 14 is a potential diagram of the C-C' and D-D' portions in FIGS. 13A and 13B during the period from the time t1 to the time t4 shown in the signal waveform diagram in FIG. 12.
Figure 15:
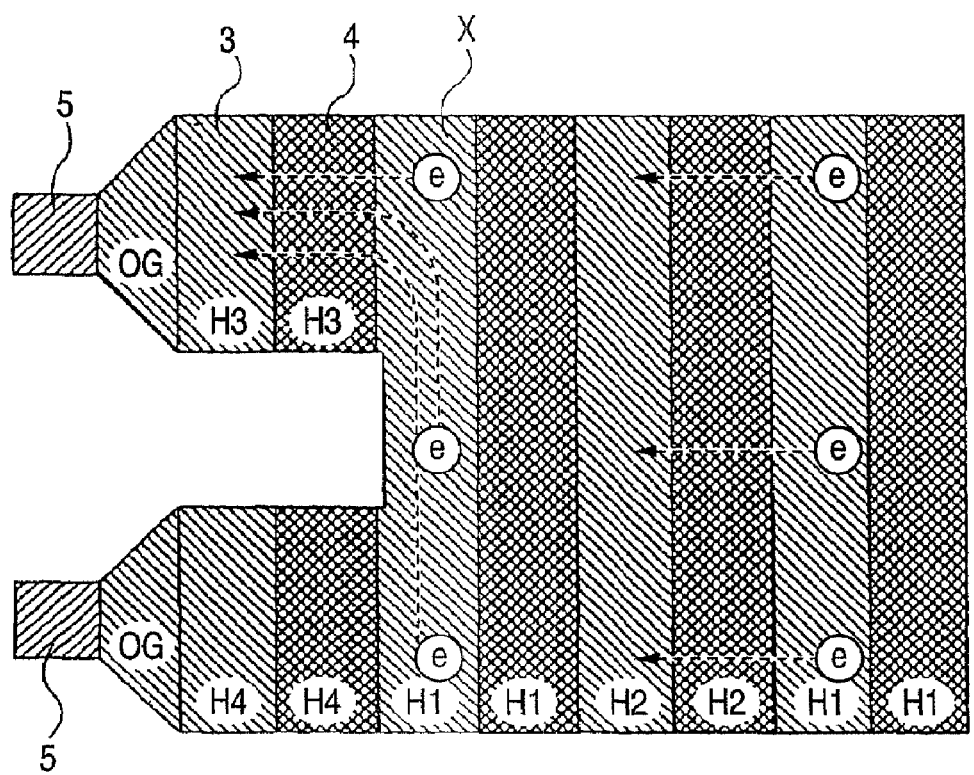
FIG. 15 is a diagram schematically illustrating the manner of movement of the charge in a channel region for constituting the HCCD shown in FIG. 11.

It should be noted that, as is apparent from FIG. 3, the respective values of the voltage of FD1 and FD2, the voltage of OG, and the voltage V5 applied to the electrode H5 are appropriately selected in such a way that the relative potential with respect to the adjacent electrode is satisfied. It goes without saying that the invention is not limited to this arrangement, and in a case where, for example, a layer structure similar to that of FIGS. 13A and 13B is adopted without providing the impurity layer 33, it suffices if the voltages applied to the respective electrodes are set to be step-like, as shown in FIG. 3.

Figure 4:
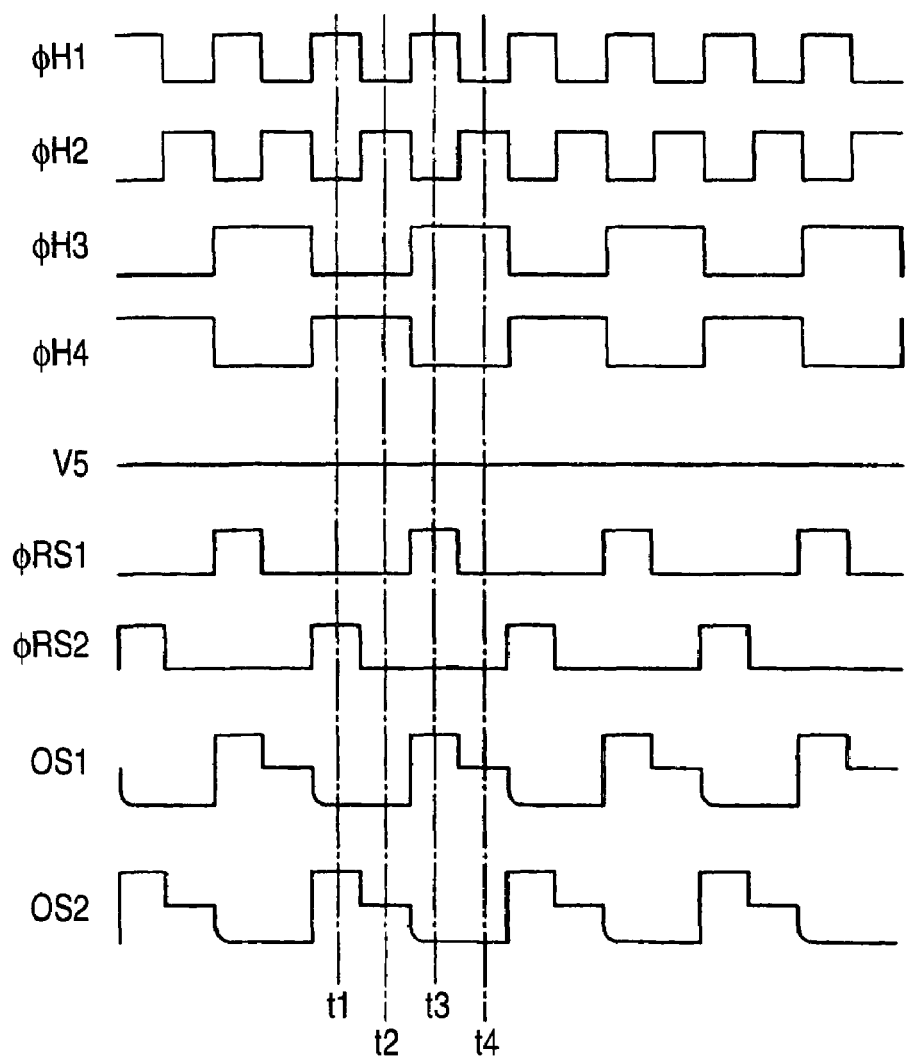
FIG. 4 is a timing diagram illustrating the waveforms and drive timings of drive signals of the HCCD shown in FIG. 1.

FIG. 4 is a timing diagram illustrating the waveforms and drive timings of drive signals of the HCCD shown in FIG. 1. FIG. 4 differs from FIG. 12 in that the voltage V5 is fixed to a predetermined dc voltage, and that the phases of φH1 and φH2 are inverted.

Figure 5:
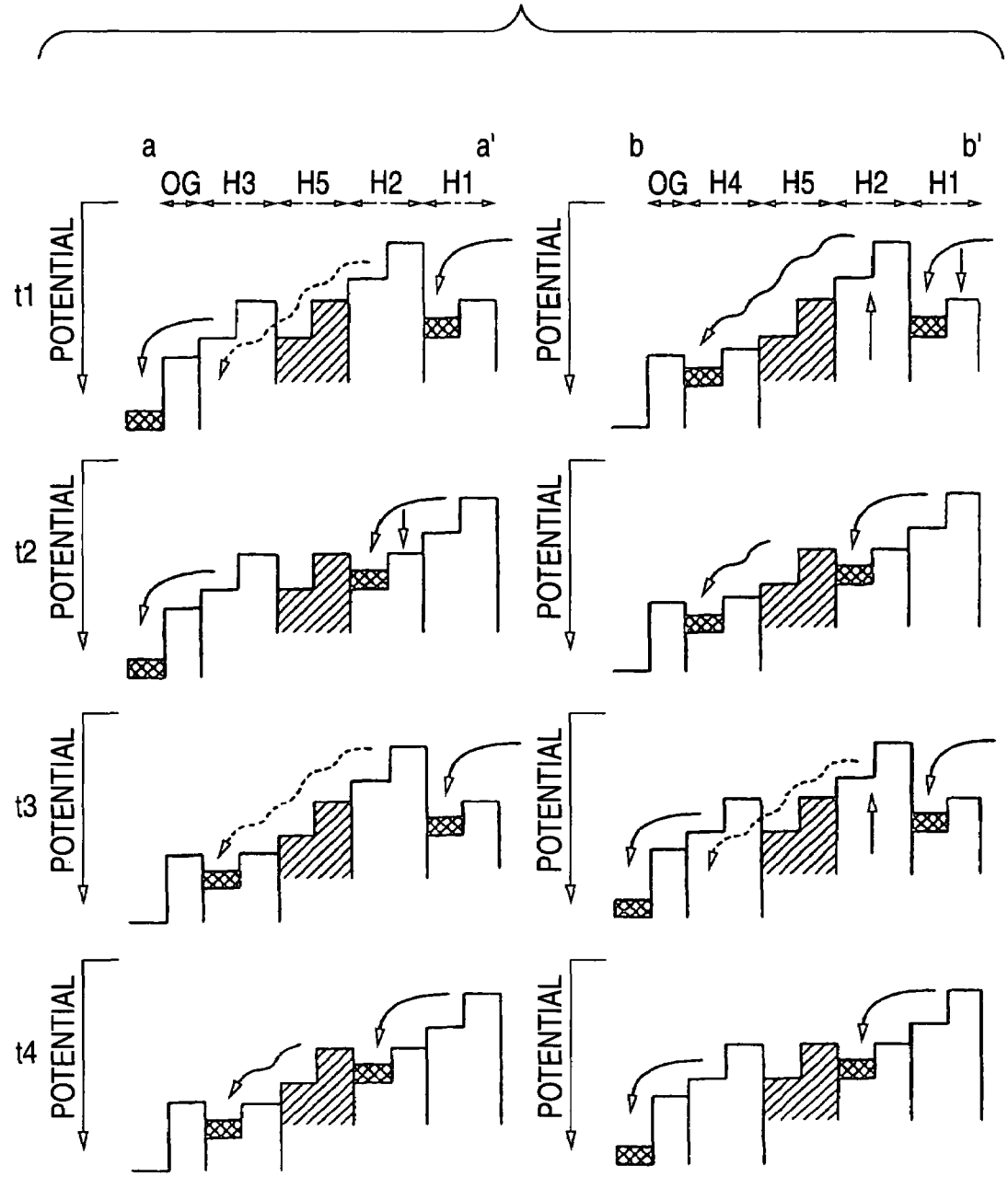
FIG. 5 is a potential diagram of the A-A' and B-B' portions in FIGS. 2A and 2B during the period from the time t1 to the time t4 shown in the signal waveform diagram in FIG. 4.

FIG. 5 is a potential diagram of the A-A' and B-B' portions in FIGS. 2A and 2B during the period from the time t1 to the time t4 shown in the signal waveform diagram in FIG. 4.

At t1 and t3 when the electrode (H2) immediately before the branch electrode (H5) is set to L, the charge is transferred to the channel regions immediately below the electrodes (H3 and H4) via the branch electrode (H5). In the related art, it is possible to transfer the charge only when, for example, the electrode (H2) immediately before the branch electrode (H5) is at a low level. In the structure in accordance with the invention, however, the charge which has been once transferred straightly passes through the channel region of the branch electrode (H5) irrespective of the fact that the electrode (H2) is reset to a high level, so that it becomes possible to make the effective charge transfer time long.

Figure 6:
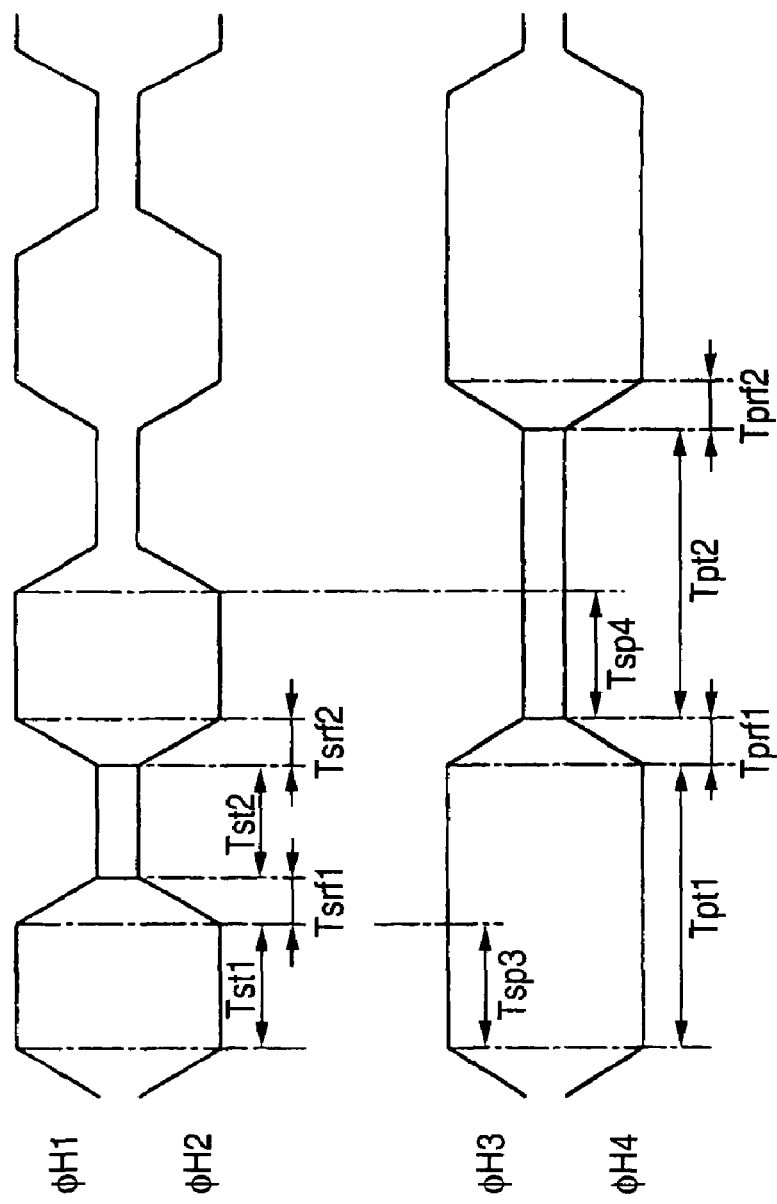
FIG. 6 is a timing diagram illustrating the detailed waveforms and phases, which are close to actual ones, of the respective transfer pulses shown in FIG. 4.

FIG. 6 is a timing diagram illustrating the detailed waveforms and phases, which are close to actual ones, of the respective transfer pulses shown in FIG. 4.

In FIG. 6, Tst1 and Tst2 denote periods of L and H of φH1 (periods of H and L of φH2), and Tsrf1 and Tsrf2 denote transition times. Meanwhile, Tpt1 and Tpt2 denote periods of H and L of φH3 (periods of L and H of φH4), and Tprf1 and Tprf2 denote transition times. In addition, Tsp3 and Tsp4 denote periods corresponding to Tst1 and Tst2.

Figure 16:
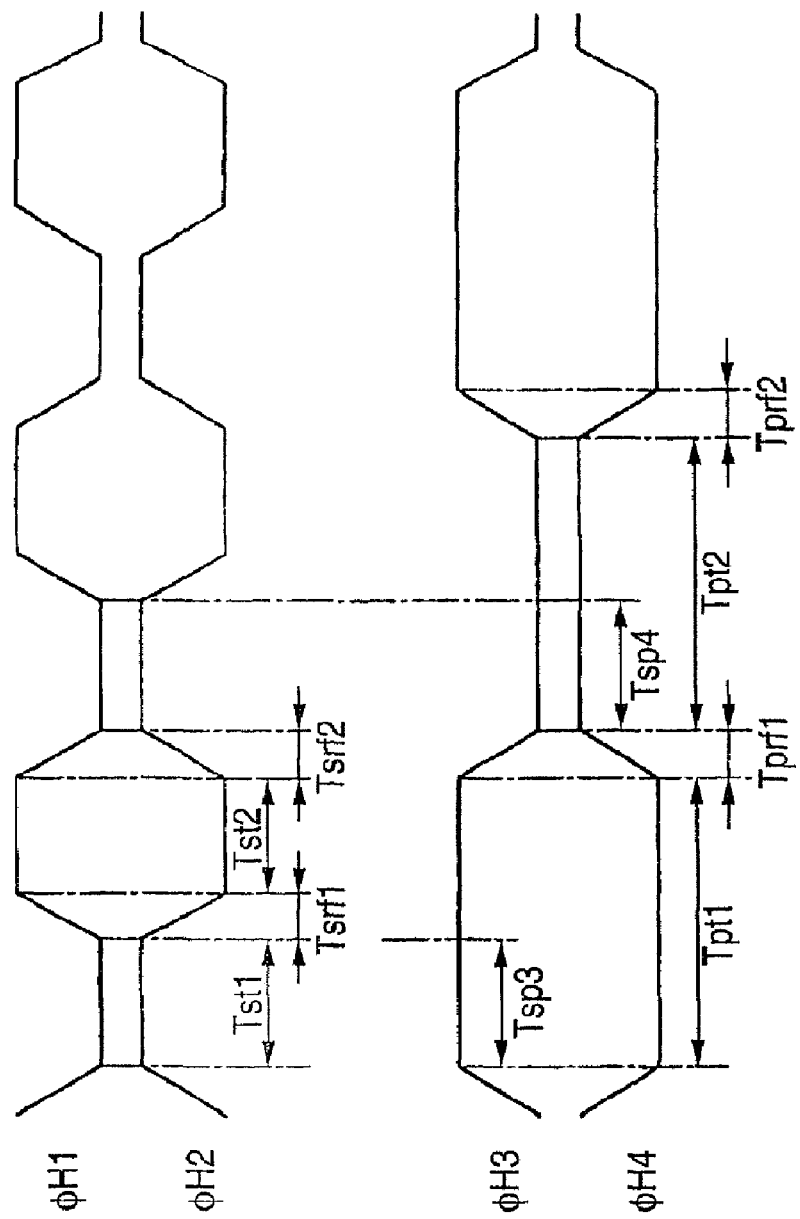
FIG. 16 is a timing diagram illustrating the detailed waveforms and phases, which are close to actual ones, of the respective transfer pulses shown in FIG. 12.

As described with reference to FIG. 16, in the case of the related-art structure shown in FIG. 11, the time for transferring the charge from the branch electrode (H5) to the channel regions below the electrodes (H3 and H4) is limited to Tsp3 and Tsp4 (=Tst1 and Tst2). Namely, as the signal output path is branched into two lines to alternately distribute and output the signal charges, the operating frequency of the circuit of the portion for outputting the signal becomes one-half, alleviating the burden of the circuit associated with that portion. And yet, of the one-half period of φH3 (φH4), the portion (i.e., Tsp3 and Tsp4) excluding the transition times can be used as the effective transfer time.

In contrast, in the case where the structure in accordance with the invention shown in FIG. 1 is adopted, at times t1 and t3, the periods when H2 immediately before the branch electrode (H5) are set to L are the periods of Tst1 and Tst2. However, as for the period for transferring the charge from the channel below the branch electrode (H5) to below the electrodes (H3 and H4) at the branch portions, of the one-half period of φH3 (φH4), the entire portion (i.e., Tpt1 and Tpt2) excluding the transition times can be effectively used as the charge transfer time, without being constrained at all by Tsp3 and Tsp4 (=Tst1 and Tst2).

Thus, although, in the related-art example, the time for transferring the charge from the channel below the branch electrode to the channel at the branch portion consists of Tst1 and Tst2, by the application of this invention, it becomes possible to secure a long transfer time of Tpt1 and Tpt2, thereby making it possible to improve the transfer efficiency.

It should be noted that, to properly form the continuous step-like potential such as the one shown in FIG. 3, it is preferable to newly provide the impurity layer 33 at a portion of a boundary between the channel regions (23 and 24), on the one hand, and the well region 12, on the other hand, as shown in FIG. 2 (however, this impurity layer 33 is not essential). In addition, the impurity layer 33 shown in FIG. 2 is one example, and may be provided as follows.

Figure 7A:
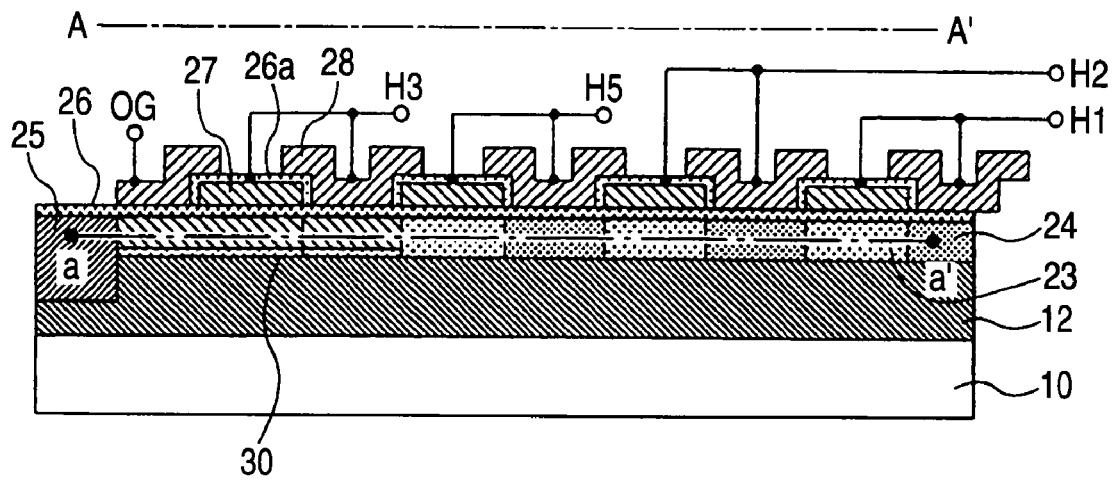
FIGS. 7A and 7B are cross-sectional views, respectively taken along lines A-A' and B-B' in FIG. 1, illustrating the structure of another example of the device in accordance with the invention.
Figure 7B:
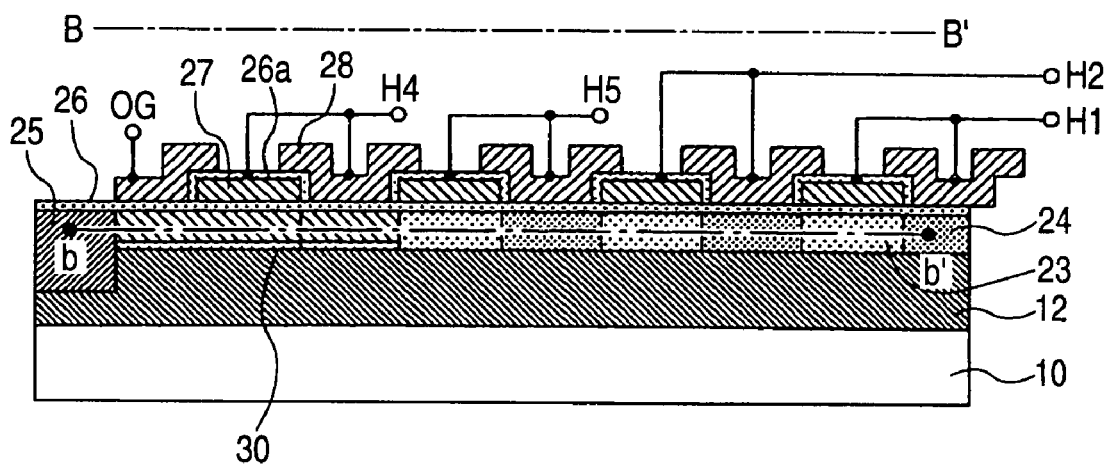

Although an impurity layer 30 is provided also in FIGS. 7A and 7B, if a comparison is made with FIG. 2, its position is different. Namely, in FIGS. 7A and 7B, the impurity layer 30 is provided in the channel from below OG to below each of H3 and H4.

Figure 8A:
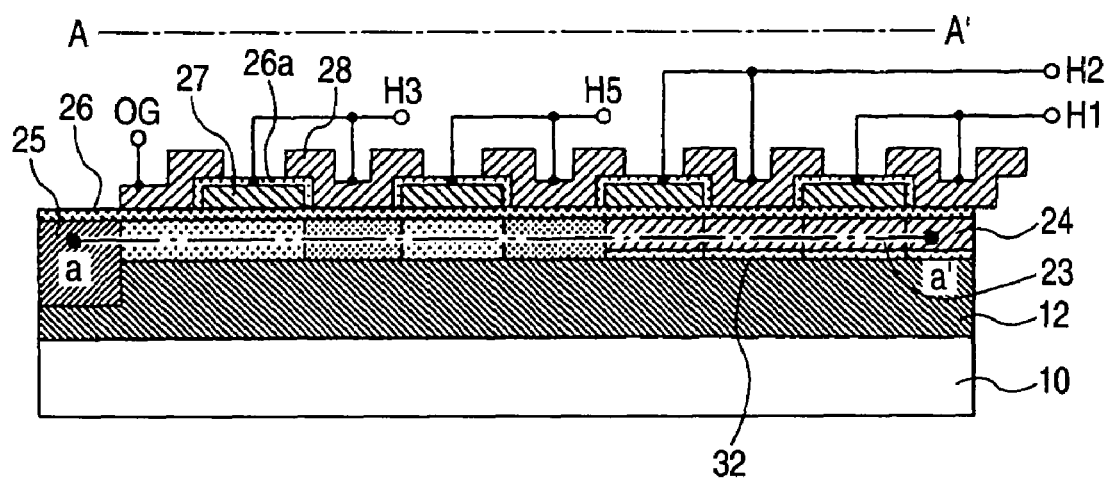
FIGS. 8A and 8B are cross-sectional views, respectively taken along lines A-A' and B-B' in FIG. 1, illustrating the structure of still another example of the device in accordance with the invention.
Figure 8B:
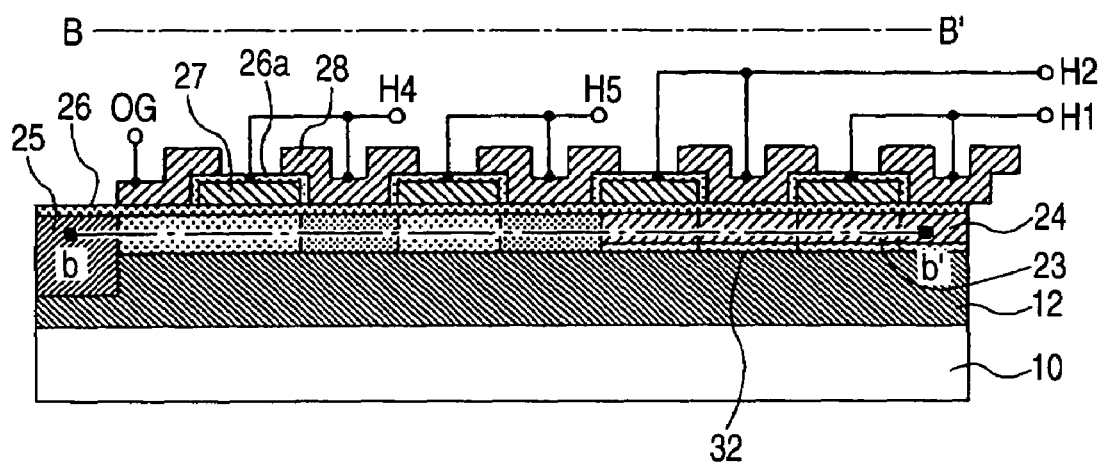

In FIGS. 8A and 8B, an impurity layer 32 is newly formed in the channel below H1 and H2. The impurity layer 32 is of the same conductivity type as the well 12.

Figure 9A:
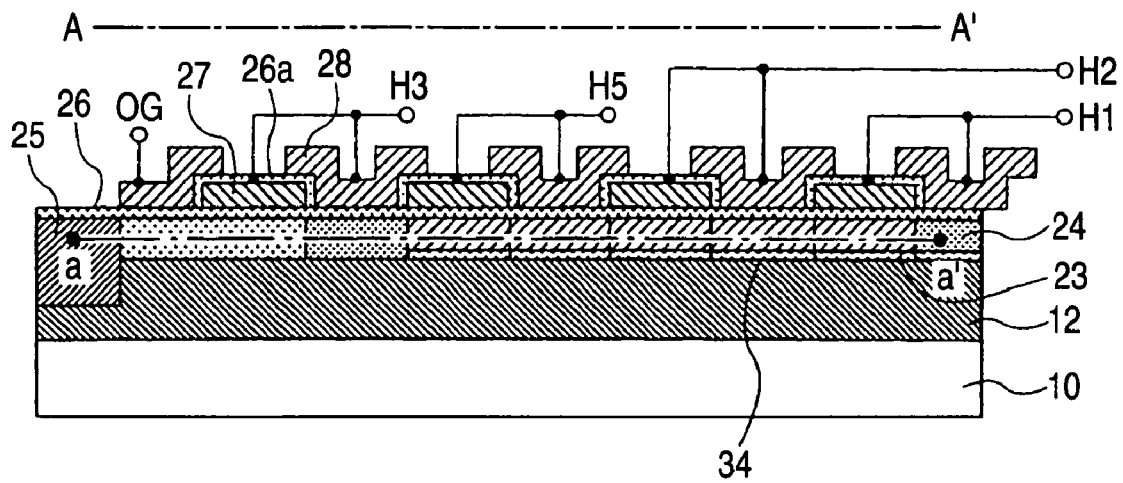
FIGS. 9A and 9B are cross-sectional views, respectively taken along lines A-A' and B-B' in FIG. 1, illustrating the structure of a further example of the device in accordance with the invention.
Figure 9B:
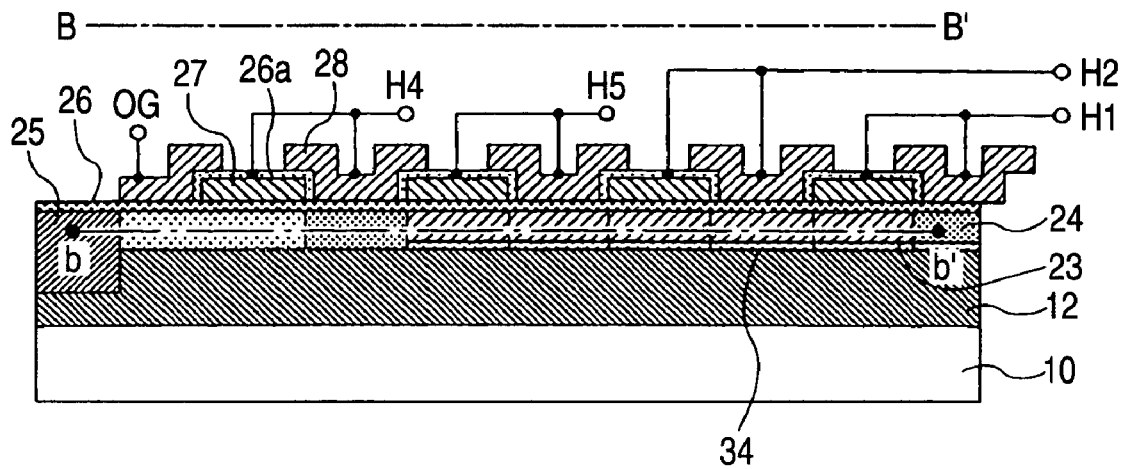

An impurity layer 34 is also provided in FIGS. 9A and 9B, but its position is different. Namely, in FIGS. 9A and 9B, the impurity layer 34 is provided in the channel from below H1 and H2 to below H5.

As for the devices shown in FIG. 2 and FIGS. 7A to 9B, although there are slight differences in the conductivity type and the position of formation of the new impurity layer, their basic structure is the same, and the channel potential when the drive voltage is applied is all the same.

As described above, according to the invention, even with the charge coupled device having a structure in which the signal output path is branched into two lines, it becomes possible to make long the time for transferring the charge to the branch portion, and improve the transfer efficiency of the charge.

It should be noted that although the branch electrode (H5) shown in the invention is formed by a two-layer electrode to facilitate an understanding of the difference with the related-art example, the branch electrode (H5) may be formed by a single-layer electrode. In this case as well, advantages similar to those described above can be obtained.

By virtue of this configuration, in a case where the charge coupled device in accordance with the invention is used as an HCCD of a solid-state imaging device in which photodiodes are arranged in a two dimensional array, the drifting of an image and the deterioration of the resolution do not occur. In addition, in a case where a color filter is laminated on the photodiodes to obtain a color signal, a pseudo-color signal is not generated. Hence, satisfactory image quality can be realized.

Figure 10:
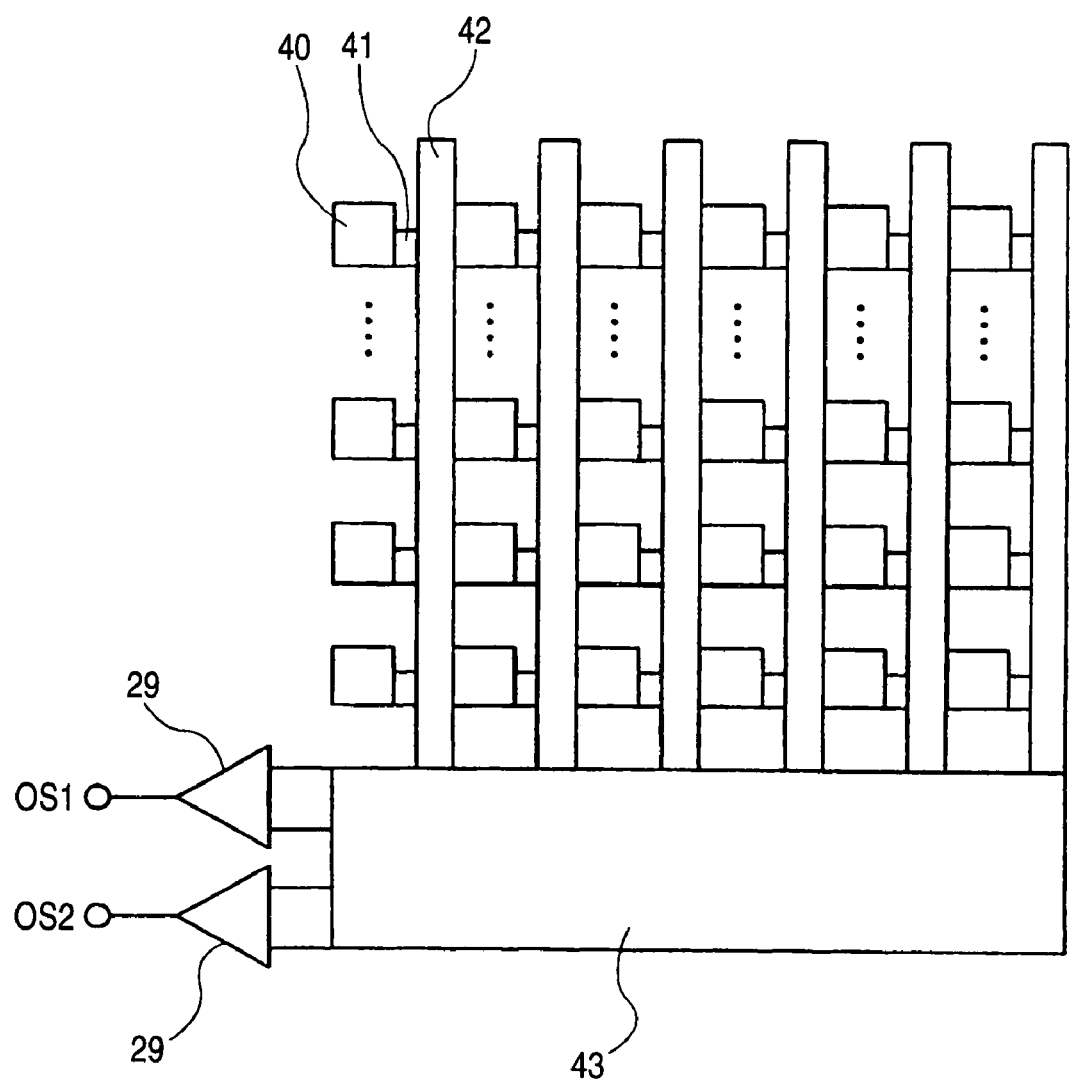
FIG. 10 is a diagram illustrating the overall configuration of an area image sensor.

It should be noted that the charge coupled device shown in FIG. 1 has been described by citing an example in which it is used in the transfer path and the charge detecting portion of a so-called linear image sensor with the photodiodes (20a to 20c) arranged in a one-dimensional array. However, the invention is not limited to this arrangement, and the charge coupled device shown in FIG. 1 may be used in the horizontal transfer path and the charge detecting portion of a so-called area image sensor with photodiodes 40 arranged in a two-dimensional array. It should be noted that, in FIG. 10, reference numeral 41 denotes a readout portion; 42, a vertical transfer path; and 43, a horizontal transfer path.

According to the invention, even in a charge coupled device having a structure in which the signal output path is branched into two lines, it becomes possible to make long the time for transferring the charge to the branch portion, and improve the charge transfer efficiency. Accordingly, in a case where the charge coupled device in accordance with the invention is used as such as a horizontal CCD of a solid-state imaging device in which photodiodes are arranged in a two-dimensional array, the drifting of an image and the deterioration of the resolution do not occur. In addition, in a case where a color filter is laminated on the photodiodes to obtain a color signal, a pseudo-color signal is not generated. Hence, excellent image quality can be realized.

The invention offers an advantage in that the time for transferring the charge to the branch portion can be made long to improve the charge transfer efficiency. Accordingly, the invention is useful when used in a charge coupled device having a structure in which the signal output path is branched into two lines.

The entire disclosure of each and every foreign patent application from which the benefit of foreign priority has been claimed in the present application is incorporated herein by reference, as if fully set forth.

What is claimed is:

1. A charge coupled device comprising:
    a semiconductor substrate of one conductivity type;
    a one-dimensional first charge coupled device including a plurality of continuous electrodes arranged in a one-dimensional array on the semiconductor substrate and a channel region formed below each of the electrodes;
    a second charge coupled device that is continuous to an end of the first charge coupled device and includes two branched portions, each of the two branched portions comprising at least one electrode arranged in the one-dimensional array;
    a detecting portion that detects as an electrical signal a charge transferred by each of the branch portions of the second charge coupled device; and
    a signal output portion that outputs a signal detected by the detecting portion,
    wherein distal one of the electrodes of the first charge coupled device, which is adjacent to the second charge coupled device, is formed independently from the other ones of the electrodes of the first charge coupled device so as to be fixed at a predetermined dc potential.

2. The charge coupled device according to claim 1,
    wherein the plurality of continuous electrodes of the first charge coupled device are driven by two-phase clocks of a predetermined frequency having inverse phases to one another, and
    one of said at least one electrode of each of the two branched portions of the second charge coupled device, which is adjacent to the distal one of the electrodes of the first charge coupled device fixed at the predetermined fixed potential, is driven by a two-phase clock having a period two times the two-phase clocks applied to the first charge coupled device.

3. The charge coupled device according to claim 1,
    wherein, by using as a boundary a first channel region below the distal one of the electrodes of the first charge coupled device fixed at the predetermined fixed potential, an impurity layer of a conductivity type that increases the potential is further provided at a portion of the channel region on the downstream side in the charge transferring direction of the first channel region.

4. The charge coupled device according to claim 1,
    wherein, by using as a boundary a first channel region below the distal one of the electrodes of the first charge coupled device fixed at the predetermined fixed potential, an impurity layer of a conductivity type that decreases the potential is further provided at a portion of the channel region on an upstream side in the charge transferring direction of the first channel region.

5. A method of driving the charge device according to claim 1, comprising
    driving each of the electrodes of the first charge coupled device and one of said at least one electrode of each of the two branched portions of the second charge coupled device, which is adjacent to the distal one of the electrodes of the first charge coupled device, such that a step-like potential continuous toward a downstream side in a charge transferring direction is formed,
    wherein a signal charge from the channel region below the electrodes of the first charge coupled device passes through a first channel region below the distal one of the electrodes of the first charge coupled device which is fixed at the predetermined dc potential, and is transferred so as to reach the channel region below said at least one electrode of each of the two branched portions of the second charge coupled device without being accumulated midway in the transfer from the first charge coupled device to the second charge coupled device.

6. The method of claim 5,
    wherein the plurality of continuous electrodes of the first charge coupled device are driven by two-phase clocks of a predetermined frequency having inverse phases to one another, and
    one of said at least one electrode of each of the two branched portions of the second charge coupled device, which is adjacent to the distal one of the electrodes of the first charge coupled device fixed at the predetermined fixed potential, is driven by a two-phase clock having a period two times the two-phase clocks applied to the first charge coupled device.

* * * * *